United States Patent
Broillet et al.

(10) Patent No.: US 9,057,655 B2
(45) Date of Patent: Jun. 16, 2015

(54) FORCE SENSOR AND METHOD FOR TESTING ITS RELIABILITY

(71) Applicants: Bernard Broillet, Misery (CH); Benoît Maillard, Marly (CH)

(72) Inventors: Bernard Broillet, Misery (CH); Benoît Maillard, Marly (CH)

(73) Assignee: MEGGITT SA (CH)

( * ) Notice: Subject to any disclaimer, the term of this patent is extended or adjusted under 35 U.S.C. 154(b) by 4 days.

(21) Appl. No.: 13/975,965

(22) Filed: Aug. 26, 2013

(65) Prior Publication Data

US 2014/0060209 A1      Mar. 6, 2014

(30) Foreign Application Priority Data

Aug. 31, 2012   (EP) .................................. 12182563

(51) Int. Cl.
| | | |
|---|---|---|
| *G01L 1/00* | (2006.01) | |
| *G01L 1/16* | (2006.01) | |
| *H01L 41/113* | (2006.01) | |
| *G01H 11/08* | (2006.01) | |
| *G01L 25/00* | (2006.01) | |
| *G01P 15/09* | (2006.01) | |
| *G01P 21/00* | (2006.01) | |

(52) U.S. Cl.
CPC ................ *G01L 1/16* (2013.01); *H01L 41/113* (2013.01); *G01H 11/08* (2013.01); *G01L 25/00* (2013.01); *G01P 15/09* (2013.01); *G01P 21/00* (2013.01)

(58) Field of Classification Search
USPC ...................................................... 73/862.68
See application file for complete search history.

(56) References Cited

U.S. PATENT DOCUMENTS

| | | | |
|---|---|---|---|
| 4,467,271 A | | 8/1984 | Ruckenbauer et al. |
| 4,586,377 A | | 5/1986 | Schmid |
| 5,052,226 A | * | 10/1991 | Schmid ...................... 73/514.34 |
| 5,117,696 A | * | 6/1992 | Schmid ...................... 73/514.34 |
| 5,402,684 A | * | 4/1995 | Engeler et al. .................. 73/794 |
| 6,498,501 B2 | * | 12/2002 | Broillet ......................... 324/727 |
| 6,655,211 B1 | * | 12/2003 | Schmid et al. ............. 73/514.34 |
| 8,074,524 B2 | * | 12/2011 | Staiger et al. .................. 73/780 |

FOREIGN PATENT DOCUMENTS

| | | |
|---|---|---|
| CA | 2 255 975 A1 | 3/2000 |
| DE | 43 16 263 A1 | 11/1993 |
| EP | 0 116 810 A1 | 8/1984 |

OTHER PUBLICATIONS

European Search Report dated Feb. 18, 2013 issued in corresponding European patent application No. EP 12 18 2563.

* cited by examiner

*Primary Examiner* — Lisa Caputo
*Assistant Examiner* — Octavia Hollington
(74) *Attorney, Agent, or Firm* — Ostrolenk Faber LLP

(57) ABSTRACT

A force sensor includes a transducer with a measuring element operatively connected to a measuring object for generating measuring signals of a force acting on the measuring object, and two in parallel transmission channels transmit mutually corresponding signals of the measuring signals independently from one another and connected in parallel to the same transducer. A test signal is evaluated in a transmission channel in which the test signal has been injected and in another transmission channel in which the test signal has not been injected. In another testing method, the transmitted signals are compared.

17 Claims, 4 Drawing Sheets ns of the two
FORCE SENSOR AND METHOD FOR TESTING ITS RELIABILITY

FIELD OF THE INVENTION

The invention relates to a force sensor comprising a transducer with a measuring element operatively connected to a measuring object for generating measuring signals of a force acting on the measuring object, and at least two transmission channels configured to transmit mutually corresponding signals of said measuring signals independently from one another. The invention also relates to a monitoring system for vibrating and/or rotating engines comprising at least one such force sensor. The invention further relates to a method for testing the operational reliability of such a force sensor.

BACKGROUND OF THE INVENTION

Such a force sensor is known from EP 0 116 810 A1. The force sensor is constituted by an accelerometer comprising two piezoelectric transducers and a measuring object provided by a common seismic mass acting on both transducers and an additional seismic mass acting on only one transducer. The sensitivity of the two transducers and the inertial forces acting thereof are so selected that the two transducers, under the action of an acceleration force, each deliver equal output signals. Due to the matching of the sensitivity of the two transducers, mutually corresponding measurement signals can be generated and transmitted by a respective transmission channel provided for each transducer.

Redundant sensors are generally used in applications where a very high reliability is required for a particular measurement. A redundant measuring method consists in comparing the mutually corresponding measuring signals, in particular measuring signals of the same parameter at a given time, in order to increase the reliability of the measurement. In order to do the comparison, both signals should ideally be identical.

In the particular case of a two channel vibration measurement, however, practice has shown that it is very difficult to obtain two individual signals which are completely identical because two force sensors, in particular two accelerometers, cannot be placed exactly on the same spot in the engine. Out of this reason, the so called dual accelerometer according to EP 0 116 810 A1 was developed, where two separate transducer elements are built into one common housing. The redundancy of this approach includes a common preload system, a common seismic mass but two separate piezoelectric transducer elements, one for each channel. The remaining of the measuring chain, i.e. the transmission cables and the charge amplifiers, are kept as separate and fully segregated transmission channels.

For a well performing system, however, the two transmission channels of the dual accelerometer must match precisely. This matching includes performance characteristics such as sensitivity, frequency response, capacitance and resonance. The matching oftentimes makes the manufacturing difficult and it also requires the utilization of a high number of piezoelectric elements and time-consuming calibration of the transducer elements. It is also important that the temperature response and the individual long time aging go close together. Thus the production of such a dual accelerometer can be very costly. A mismatch or not close enough matching of the signals leads also very often to false alarms. In addition, the size and weight of such a device can present disadvantages in the mounting on aircraft engines, where the preference is small size and weight.

OBJECTS AND SUMMARY OF THE INVENTION

It is an object of the present invention to remedy at least one of the above mentioned deficiencies and to allow an easier production of the initially addressed force sensor and/or to allow a reduction of its construction size and/or to provide the force sensor with at least one improved operational characteristics, in particular regarding its dynamic behavior and/or temperature response and/or frequency response. It is a further object of the invention to provide an advantageous application of such a force sensor. It is another object of the invention to provide a method for testing the operational reliability of such a force sensor, in particular by avoiding at least one disadvantage of known force sensors in operation.

Accordingly, in a force sensor according to the invention, at least two transmission channels are connected in parallel to the same transducer such that the transmitted signals at the output of each transmission channel can be verified. In this way, the mutually corresponding measuring signals corresponding to a force acting on the measuring object, in particular at a given time or time interval, can be fed into the transmission channels from the same transducer that is operatively connected to the at least one measuring object. Thus, the measuring signals in both transmission channels can be based on the force acting on the measuring object as derived from the same measuring element of the transducer. Thereby, the transducer preferably only comprises a single measuring element.

This has the economical advantage that the production costs of the force sensor can be decreased, since the number of required transducers can be reduced and the rather complex matching of the transducer properties with respect to the performance properties of an additional corresponding transducer can be omitted. In particular, only a single calibration of a transducer may be needed, resulting in lower costs and less rejects in production due to a mismatch of both channels. Furthermore, no matching of the transducer performance properties to the remaining sensor system will be needed. In particular, the measuring element provided in the transducer may be not of a particular high quality. For instance, any piezoelectric material may be used, in particular a material with a comparatively lower precision in its temperature response.

Moreover, constructional advantages of a reduced sizing and/or weight of the force sensor can be achieved by reducing the number of its components. The proposed constructional features of a force sensor according to the invention may also allow an easy retrofitting into existing systems, in particular they may be applied in the place of already existing force sensors, wherein no change in form and fit of the sensor and/or cabling would be needed.

At the same time, a high reliability of the measurement system can be maintained or even increased. In particular, it has been recognized in the course of the present invention that the downgraded redundancy aspect of having separated transducers for each transmission channel can be compensated or even improved by the operational advantages of applying only one transducer as a common element for these transmission channels.

These operational advantages may comprise the transducer exhibiting a single performance characteristics, in particular a single dynamic behavior, a single temperature response, etc., which allows a perfect comparison of the output signals at the respective transmission channels. Moreover, due to the isolated transducer, improved performance characteristics regarding the frequency response and/or resonance frequency can be expected. Another operational advantage can be seen in a higher reliability and a larger mean time between failures (MTBF), corresponding to the cumulated number of failures per cumulated time of operation, since the proposed force sensor contains less elements prone to failure.

A further operational advantage may be an enhanced functional verifiability and error detectability. This advantage may be crucial, since in modern aerospace and industrial applications it is not so much the number of failures that concern, but the number of failures which remain undetected. In particular, virtually all sources of failures can be made detectable in a force sensor according to the invention, which is not possible in prior art systems. For error detection, the line and contact monitoring of a standard build in test (BIT) system may be employed. An advantageous method for error testing is described further below.

According to a preferred configuration, the transducer connected to the at least two transmission channels is the single transducer that is operationally connected to the measuring object. More preferred, the force sensor does only comprise one such transducer. In this way, the production costs, weight and sizing of the force sensor can be minimized and at the same time a high operational reliability can be achieved, as already detailed above.

In principle, the advantage of a redundancy of more than one transducer can also be combined with the above mentioned operational advantages of a common transducer for the at least two transmission channels, by incorporating at least two transducers into the force sensor, each transducer comprising a measuring element operatively connected to the measuring object, wherein at least two respective transmission channels are connected to each transducer. It is noted, however, that modern transducers, in particular transducers based on piezoelectric measuring elements, have become highly reliable components by virtue of improved processing and fabrication techniques. Thus, the redundancy of the transducer may be less a significant factor. Field experience of prior art systems, however, tells that most of the failures occur on the transmission channels, in particular in their connectors and transmission cables, which preferably remain fully redundant in the force sensor system according to the invention.

For a verification of the transmitted signals at the output of each transmission channel, various possibilities are conceivable. According to a first preferred verification method, the transmitted signals are related to each other, in particular by means of a comparison of the transmitted signals. An according comparator circuit may be provided at the output of the transmission channels or as a common intermediary component in the transmission channels. The occurrence of a measurement and/or transmission error may then be recognized based on a predetermined difference value that is exceeded by the compared transmission signals. This method provides an ongoing permanent checking of the integrity of the transmission channels.

According to a second preferred verification method, the transmitted signals are individually investigated with respect to an expected signal value. For instance, a measurement under known measurement conditions or the injection of at least one test signal may be used to provide a certain expectation value of the transmitted signals. An according verification circuit of the test signal may be provided at the output of each transmission channel or as an intermediary component in each transmission channel. Most preferred, both verification methods are applicable in a force sensor according to the invention.

Preferably, the mutually corresponding measuring signals that are independently transmitted by each transmission channel are representative for the same parameter of the force acting on the measuring object, in particular at a specific time or time interval or in periodic time intervals. This parameter may include an acceleration, a velocity, a displacement, a pressure, or a pressure change of the measuring object.

According to first preferred arrangement, the measuring object comprises at least one seismic mass such that said measuring signals are representative of a force acting on the seismic mass as a result of an acceleration of the seismic mass. In this way, an accelerometer may be realized.

Such an accelerometer may constitute a particular advantageous operational field of the force sensor, since accelerometers are often used in application areas that require a small sensor sizing and at the same time demand a very high reliability of the force measurement.

According to second preferred arrangement, the measuring object comprises at least one gas and/or liquid such that said measuring signals are representative of a pressure and/or pressure change of said gas and/or liquid. In this way, a pressure transducer may be realized. In particular, a membrane may be disposed inside or outside the force sensor, on which membrane the pressure and/or pressure change of the gas and/or liquid will act. Preferably, the measuring element of the transducer is then operatively connected to the membrane.

Preferably, in particular in both of the above arrangements, the transducer comprises a positive and a negative electrode for collecting said measuring signals generated by said measuring element. Thus, the measuring signals derived from the measuring element preferably can be tapped at those electrodes. Preferably, each electrode is connected to each transmission channel.

According to a first preferred configuration, the transmission channels are substantially directly connected to at least one of the respective electrodes. Thereby, for each transmission channel a separate contact point is preferably provided on at least one of said electrodes, more preferred on each of said electrodes. Most preferred, each of the transmission channels is preferably connected to another end of the respective electrode. In this way, redundancy can be preserved over essentially the total length of the transmission channels including the connections inside the sensor housing.

According to a second preferred configuration, at least two of the transmission channels are connected to the respective electrode in that they comprise a common connection line connected to the electrode. More preferred, the transmission channels have a common node on the common connection line that is connected to the electrode. Preferably, the common node is located in close proximity to the electrode in order to preserve redundancy over a possibly large distance of the transmission channels. Thus, the common connection line is preferably comparatively short with respect to the total length of the transmission lines. In particular, the common connection line and/or the common node is preferably arranged in between the electrode and a connector for a transmission cable of the transmission channel and/or inside a housing in which the transducer is arranged.

Alternatively, the common connection line may also extend inside a common connector for several transmission cables of the transmission channels and/or outside a housing in which the transducer is arranged, in order to facilitate the wiring of the connector and/or mounting of the transmission cables. Thereby, the common node may also be arranged inside a common connector for several transmission cables of the transmission channels and/or outside a housing in which the transducer is arranged. Moreover, the common node may also be arranged further upstream the transmission channels, in particular further upstream of a common connector for the transmission cables, wherein a major part of the transmission line is preferably still provided as two fully redundant transmission channels. As an example, at least two third of the total length of the transmission line is preferably provided by at least two separate transmission channels, more preferred at least ninety percent of the total length of the transmission line.

In this second preferred configuration there is preferably no redundancy of the sensor itself as all parts within the sensor are common for both transmission channels. However the cost of the sensor arrangement is reduced and its reliability increased due to using less parts.

In view of the reliability, the measuring system preferably contains the least possible numbers of connectors because the practice shows that the connectors are normally the most vulnerable parts of the whole measuring system. However the practicality to install and maintain the measuring system dictates the presence of a certain number of connectors. Knowing about the relatively low reliability of connectors it has been realized in the present invention that it is extremely helpful to provide testability of the transmission channels between the transducer and the electronics unit.

Preferably, at least one connector is provided connecting at least one transmission channel to the electrodes. More preferred, a respective connector is provided for each of said transmission channels, by which connector the respective transmission channel is connected to said electrodes. This may have the advantage of a full redundancy of the transmission channels including the connectors, such that also the connectors are easily verifiable as a possible error source. In another preferred configuration, a common connector is provided for said transmission channels, by which connector the transmission channels are commonly connected to said electrodes. This may allow a simplified wiring or mounting of the transmission channels.

The connector preferably comprises a positive and a negative pole. Each of those poles is preferably connected to the corresponding electrode via a connection wire. For each transmission channel, a transmission cable is preferably provided that is mounted to the poles of the respective connector. Preferably, the connectors are arranged on mutually opposed sides of the transducer to facilitate the mounting of the transmission cables thereon.

Preferably, the connectors are integrated in the walls of a housing in which the transducer is enclosed. More preferred the connectors extend through the housing walls. Those connectors are subsequently referred to as feed-through connectors. The transmission cables of each transmission channel can preferably be plugged in the respective feed-through connector from the exterior of the housing. Thus, the installation of the transmission channels can be facilitated. Preferably, the measuring object is partially or fully included in the housing.

Preferably, the transducer is mounted on a base plate. The base plate, transducer and measuring object are preferably arranged in series. Thereby, the measuring element of the transducer is preferably clamped mechanically in between the base plate and the measuring object. A pre-load arrangement, in particular including a bolt and a nut, is preferably applied to achieve the mechanical clamping of the transducer. The transducer is preferably electrically insulated from the base plate and/or the housing walls, in particular by means of insulation plates arranged therebetween.

According to a preferred configuration, the first transmission channel is connected to the electrodes at one end of the measuring element and the second transmission channel is connected to the electrodes at the opposed end of the measuring element. This may allow a facilitated wiring of the transmission channels in parallel to the transducer, in particular a facilitated wiring of respective connectors.

Preferably, the measuring element of the transducer is constituted by a piezoelectric measuring element, in particular a stack of piezoelectric plates. The measuring element made from such a piezoelectric member has the advantage of being well proved and tested in various intended application areas of the force sensor, in particular in the field of monitoring systems for vibrating and/or rotating engines, such as aircraft engines and/or gas turbines. In principle, however, also other measuring elements sensitive to the force applied on the measuring object are conceivable.

According to a preferred configuration, the electrodes substantially extend through the stack of piezoelectric plates from one end to an opposed end thereof. Moreover, the electrodes preferably extend in a meandering course through the stack of piezoelectric plates. Thereby, each electrode is preferably constituted by several contact plates that are interconnected in a string. The contact plates are preferably placed on the respective positively or negatively charged side of each piezoelectric plate within the stack. Thereby, the contact plates are preferably strung together by conductive interconnectors in between, each extending along an exterior face of the piezoelectric plates. The electrodes are preferably bent at the transition regions of the contact plates and the conductive interconnectors to provide the meandering shape of the electrodes extending through the stack of piezoelectric plates. An electrical contact to the transmission channels, in particular to a respective connector, is preferably provided at each end of the meandering electrodes.

Preferably, each transmission channel comprises a signal amplifier. Each signal amplifier is preferably included in the respective transmission channel externally from a housing, in which the transducer is arranged. More preferred, the respective signal amplifier is arranged at the output of each transmission channel. Preferably, the signal amplifiers are included in a single electronic unit. Moreover, the signal amplifiers are preferably connected to the transducer via a connector and/or a transmission cable of the respective transmission channel. Preferably, the signal amplifiers include at least one of DC decoupling means, filters, integrators and means to render the input fully floating with respect to ground. It has been found that these components, most notably the DC decoupling means, can be essential to provide a signal of a desired quality at the output of the signal amplifiers, in particular to provide measurement values of a high precision and/or to allow a testing of the sensor reliability in a method further detailed below. Preferably, the DC decoupling is realized by serial capacitors placed at the positive input and negative input of the signal amplifier.

Preferably, at least one serial switch is arranged before the input of at least one signal amplifier, preferably of each signal amplifier, in order to permit a selective application of the signal amplifiers. This can contribute to a further improvement of error location detection.

Preferably, a test signal injector is provided in at least one of the transmission channels. The test signal injector is preferably provided at the input of a signal amplifier of the respective transmission channel.

According to a first preferred configuration, the test signal injector is included in only one of the transmission channels. In the force sensor according to the invention, such an arrangement of a single test signal injector may not only allow to test the respective transmission channel with respect to possible error sources, but also other transmission channels, in which no such test signal injector is provided, and also other possible error sources essentially within the complete force sensor, as further detailed below. Thus, the arrangement of a single test signal injector in the force sensor according to the invention can provide a high reliability standard, by advantageously reducing the number of required components.

According to a second preferred configuration, a respective test signal injector is included in at least two transmission channels. By such a redundancy of the test signal injector, the reliability standard may be further enhanced and a locality determination of a possible error source may be further facilitated. Preferably, the test signal injector is provided at the input of a signal amplifier of the respective transmission channel.

Preferably, the test signal injector comprises at least one signal generator and at least one signal converter, in particular a capacitor, to convert the test signal generated by the signal generator into corresponding electric charges which can be fed into the transmission channel. More preferred, the test signal injector further comprises at least one signal inverter, to create an identical but inverted test signal as generated in the signal generator which can also be fed into the transmission channel.

Accordingly, the invention also comprises a testing unit comprising at least one test signal injector as described above, that is included in the force sensor in the above described manner.

Accordingly, the invention further comprises a first method for testing the operational reliability of the force sensor comprising at least one test signal injector. The testing method preferably comprises the step that a test signal is injected into at least one transmission channel by the test signal injector. Preferably, the test signal is injected at the input of the signal amplifier of the respective transmission channel. Preferably the test signal is generated by a signal generator and injected by means of a signal converter, in particular one or more injection capacitors.

Preferably, the testing method further comprises the step that the test signal is evaluated in the transmission channel in which the test signal has been injected. Thereby, the test signal preferably transits the signal amplifier and appears as an output signal at the output of the signal amplifier in the respective transmission channel. Preferably, this output signal is used to validate the transmission characteristics of the at least one component that has been traversed by the test signal, in particular the signal amplifier.

Preferably, the testing method further comprises the step that the test signal is evaluated in another transmission channel in which the test signal has not been injected. Thereby, in particular when the test signal has been injected at the input of the signal amplifier of a transmission channel, the test signal preferably traverses the transmission channel in which it has been injected in the direction of the transducer of the force sensor. The test signal then preferably enters the other transmission channel which is connected to the transducer, preferably in a parallel connection. Thereby, the test signal preferably also transits the transducer.

After transmittal to the other transmission channel, the test signal is preferably transmitted to the signal amplifier in the other transmission channel. Finally, the test signal preferably appears as an output signal at the output of the signal amplifier of the other transmission channel, in which the test signal initially has not been injected. Preferably, this output signal is used to validate the transmission characteristics of the components that have thereby been traversed by the test signal, in particular the respective signal amplifier and/or one or both of the respective transmission lines and/or the transducer.

In this way, the injection of a test signal in one transmission channel preferably allows to validate a flawless functioning of substantially all components of the force sensor on the basis of a corresponding output signal on each signal amplifier. By validation of these output signals in a remaining transmission line further upstream of each signal amplifier, the transmission characteristics of other users of such output signals in the remaining transmission line could also be tested.

Thus, virtually all sources of failures in the transmission line of the measurement signal can be made detectable in a force sensor according to the invention, in particular by applying the above described method. In contrast, prior art systems do only allow a verification of the transmission characteristics of components that are disposed further upstream from the point of the transmission channel, at which the test signal has been injected. In consequence, at least some components that are included in prior art systems downstream from the test signal injection, such as the transducers of the force sensor and remaining parts of the transmission channels, cannot be verified accordingly. Those unverifiable error sources, which can be largely reduced or even removed by the present invention, are a main concern in modern aerospace and industrial applications.

The invention further comprises a second method for testing the operational reliability of the force sensor. In that method, the measuring signals generated by the transducer and transmitted separately by the transmission channels are preferably compared with each other. Thereby, the measuring signals are preferably provided by a single transducer only. The result of this comparison is then preferably used to assess the correctness of the signals. Preferably, the signals have been separately amplified before their comparison by respective signal amplifiers.

The first and/or second testing method are preferably applied before and/or during operating the force sensor under normal measurement conditions. Thereby, the second testing method during normal force sensor operation preferably comprises a permanent comparison of the outputs of the first transmission channel versus the second transmission channel connected to the transducer. Preferably, when a predetermined difference of the two transmission channels is exceeded, an alarm is triggered. Preferably, the force sensor is configured to operate both of the first and second testing method, since the two different ways of error recognition and error location detection can add up to a higher operation reliability.

The invention also comprises a monitoring system for vibrating and/or rotating engines, in particular aircraft engines and/or gas turbines, in which at least one force sensor as described above is included. Thereby, the force sensor is preferably directly mounted to the engine or other structure being monitored. A preferred mounting of the force sensor includes a fixation by means of bolts, in particular through a base plate of the force sensor, on which the transducer is mounted.

BRIEF DESCRIPTION OF THE DRAWINGS

The invention is explained in more detail hereinafter by means of preferred embodiments with reference to the drawings which illustrate further properties and advantages of the invention. The figures, the description, and the claims comprise numerous features in combination that one skilled in the art may also contemplate separately and use in further appropriate combinations. In the drawings:

DETAILED DESCRIPTION OF THE PREFERRED EMBODIMENTS

Figure 1:
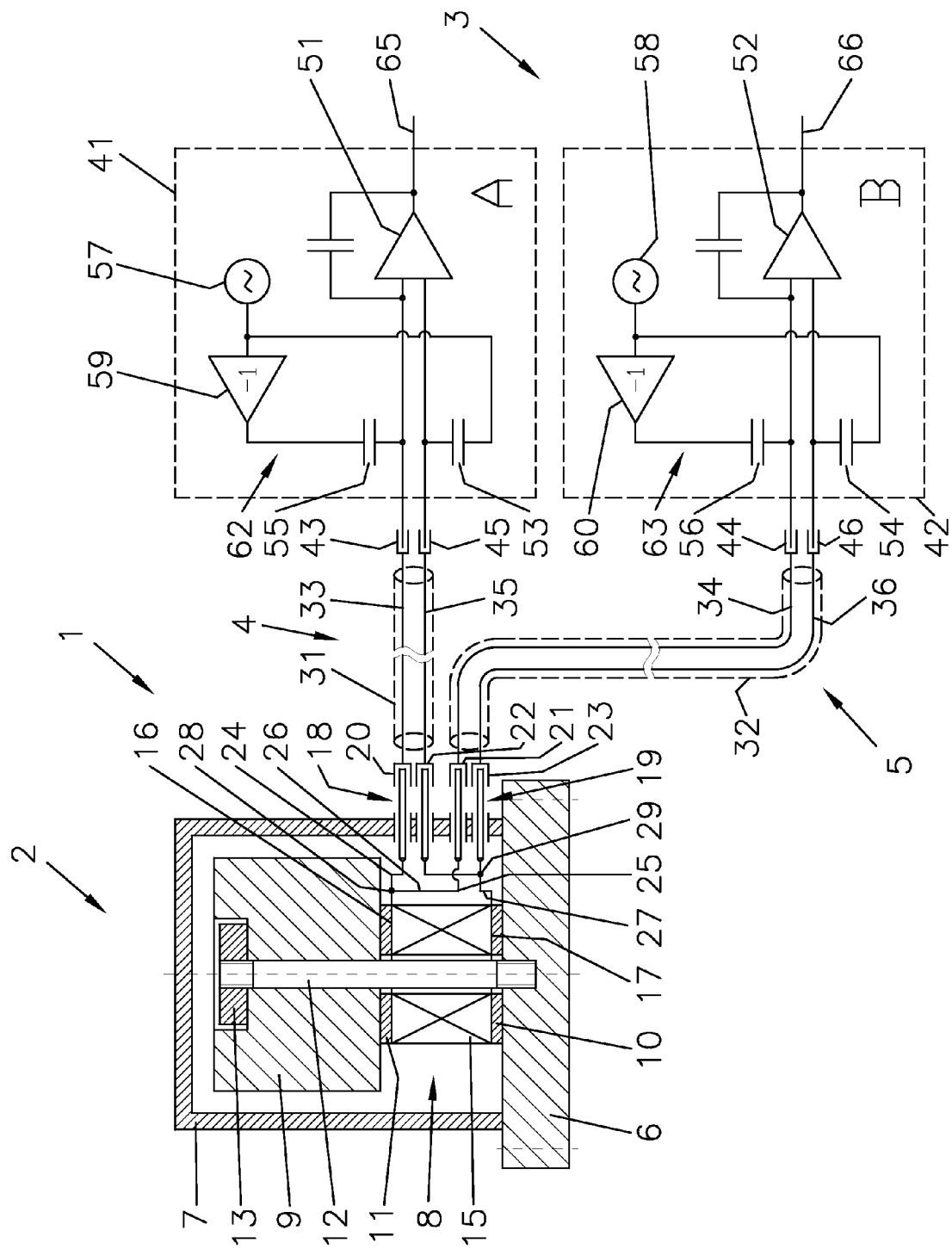
FIG. 1 is a schematic representation of an accelerometer according to a first embodiment.

FIG. 1 shows a force sensor 1 in the form of an accelerometer. The accelerometer 1 comprises a sensing unit 2 and an electronics unit 3 for delivering an output signal representative of a measurement from sensing unit 2. Sensing unit 2 and electronics unit 3 are interconnected via two transmission channels 4, 5 by which mutually corresponding measuring signals can be transmitted from the sensing unit 2 to the electronics unit 3.

Sensing unit 2 comprises a base plate 6 on which it can be mounted on an engine or other structure to be monitored, in particular by means of bolts. On the opposed side of the mounting surface of base plate 6, a housing 7 is arranged. Inside housing 7, a piezoelectric transducer 8 is disposed on top of base plate 6. On top of piezoelectric transducer 8, a seismic mass 9 is arranged. Thus, a series arrangement of base plate 6, piezoelectric transducer 8 and seismic mass 9 is provided.

Piezoelectric transducer 8 is electrically isolated from base plate 6 and seismic mass 9 by means of respective insulation plates 10, 11 arranged therebetween. The series arrangement of base plate 6, insulation plate 10, piezoelectric transducer 8, insulation plate 11 and seismic mass 9 is mechanically fastened by means of a pre-load fixation. The pre-load fixation comprises a bolt 12 extending through the center of said series arrangement and a nut 13 on top of seismic mass 9.

Piezoelectric transducer 8 comprises a piezoelectric measuring element 15 arranged in between a positive electrode 16 and a negative electrode 17 for collecting a measuring signal generated by piezoelectric measuring element 15. Seismic mass 9 thus constitutes a measuring object that is operatively connected to piezoelectric measuring element 15 in such a way that measuring signals can be generated in measuring element 15 which are representative of a force acting on seismic mass 9 as a result of an acceleration of seismic mass 9.

Integrated into housing 7, two electrically separated feed-through connectors 18, 19 are included. Feed-through connectors 18, 19 pass side-by-side through the wall of housing 7. Each feed-through connector 18, 19 comprises a positive pole 20, 21 and a negative pole 22, 23. Positive pole 20, 21 of each feed-through connector 18, 19 is connected to positive electrode 16 of piezoelectric transducer 8 via a respective positive connection wire 24, inside housing 7. Correspondingly, negative pole 22, 23 of each feed-through connector 18, 19 is connected to negative electrode 17 of piezoelectric transducer 8 via a respective negative connection wire 26, 27 inside housing 7.

Positive connection wires 24, 25 meet at a common node 28 in close proximity to positive electrode 16 of piezoelectric transducer 8. Negative connection wires 26, 27 meet at a common node 29 in close proximity to negative electrode 17 of piezoelectric transducer 8. From common nodes 28, 29 a respective common connector line leads to positive electrode 16 and to negative electrode 17, respectively. In this way, feed-through connectors 18, 19 are connected in parallel to piezoelectric transducer 8.

Each of transmission channels 4, 5 further comprises a transmission cable 31, 32. Each transmission cable 31, 32 comprises a positive signal line 33, 34 and a negative signal line 35, 36. Each transmission cables 31, 32 is plugged into a respective feed-through connector 18, 19 in such a way, that positive signal lines 33, 34 are in electrical contact with positive poles 20, 21 and negative signal lines 35, 36 are in electrical contact with negative poles 22, 23.

Electronics unit 3 comprises two substantially identical subunits 41, 42. Subunits 41, 42 each comprise a positive signal input 43, 44 and a negative signal input 45, 46, which are connected to the respective signal lines 33, 34, 35, 36 of transmission cables 31, 32. Subunits 41, 42 further comprise a respective signal output 65, 66 on which an output signal for each transmission channel 4, 5 is provided. In this way, mutually corresponding measuring signals generated by piezoelectric transducer 8 can be transmitted to each subunit 41, 42 via respective transmission cable 31, 32 and delivered as an output signal from each subunit 41, 42 via respective signal output 65, 66. The two distinguished signal ways are indicated by the letters A and B in FIG. 1.

The redundancy of this approach includes a common piezoelectric transducer element 8, a common preload system constituted by preload bolt 12 and nut 13, a common seismic mass 9 and common housing 7 and base-plate 6, but two separate feed-through connectors 18, 19, one for each channel A and B. Thus, the accelerometer 1 is characterized by one single piezoelectric transducer element 8 with two output connectors 18, 19 which are connected in parallel to the transducer element 8.

When the sensing unit 2 is vibrated the inertial forces of seismic mass 9 will act on common transducer element 8 which will through the piezoelectric effect produce an electrical charge which corresponds to the acting inertial forces and thereby to the acceleration that sensing unit 2 is exposed to. The electrical charge will appear on both of the separate feed-through connectors 18, 19 of channels A and B.

The charge signals are then carried by means of transmission cables 31, 32 to electronics unit 3. Subunits 41, 42 of electronics unit 3 each comprise a respective signal amplifier 51, 52. For simplification these charge amplifiers 51, 52 are symbolized by a very basic schematic in FIG. 1 and may be much more sophisticated including DC decoupling means, filters, integrators, means to render the input fully floating with respect to ground, etc. Said DC decoupling means may particularly consist of serial capacitors put at both positive and negative inputs of charge amplifier 51, 52 shown in FIGS. 1, 4 and 5. Thereby, the serial capacitors are preferably provided in such a way that the resulting input impedances of charge amplifier 51, 52 together with piezoelectric transducer element 8, 73, to which charge amplifiers 51, 52 are connected electrically in parallel, work as a charge divider for the charge produced by piezoelectric element 8, 73.

At the input of each signal amplifier 51, 52, a test signal injector 62, 63 is provided which allows injecting of a test signal. Each test signal injector 62, 63 comprises a pair of injection capacitors 53, 54 and 55, 56, a signal generator 57, 58 and an inverter 59, 60. The test signal is generated by respective signal generator 57, 58. An identical but inverted signal is created by respective inverter 59, 60. Capacitors 53, 54, 55, 56 convert the test signal voltage into corresponding electrical charges.

The method of test consists in injecting a test signal generated by signal generators 57 by means of injection capacitors 53, 55 at the input of charge amplifier 51 of channel A. The test signal transits the charge amplifier 51 and appears as output signal at the output of the charge amplifier 51 of channel A. By validation of this output signal the transmission characteristics of the charge amplifier 51 may be checked of flawless functioning.

The test signal generated by signal generator 57 and injected by capacitors 53, 55 will also be transmitted from the input of charge amplifier 51 trough transmission cable 31 towards sensing unit 2 and enter sensing unit 2 via connector 18. As the two transmission channels 4, 5, in particular the two connectors 18, 19, are connected in parallel to piezoelectric transducer 8, the test signal will also appear at the output of sensing unit 2 for the signal way B, namely at connector 19. From there the test signal transits through transmission cable 32 to the input of charge amplifier 52 of subunit 42 and then transits the charge amplifier 52 and finally appears as an output signal at the output of charge amplifier 52 of channel B. By validation of this output signal the transmission characteristics of charge amplifier 52 may be checked of flawless functioning. By validation of the test signals further upstream of signal ways A and B by users of the output signals, the remaining transmission line can also be tested.

Figure 2:
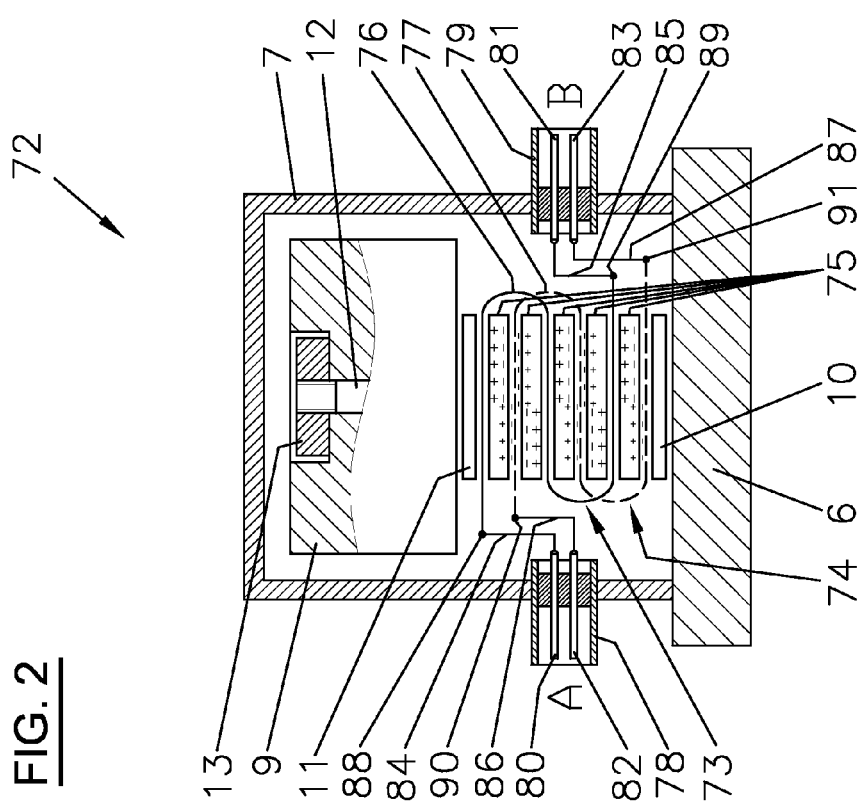
FIG. 2 is a schematic representation of a sensing unit of an accelerometer according to a second embodiment.

FIG. 2 depicts a second embodiment of a sensing unit 72 of an accelerometer according to the invention. Components of sensing unit 72 that directly correspond to respective components of sensing unit 2 shown in FIG. 1 are indicated by the same reference signs.

A piezoelectric transducer 73 of sensing unit 72 is correspondingly arranged as compared to piezoelectric transducer 8 in sensing unit 2. Piezoelectric transducer 73 comprises a measuring element 74 that is constituted by a number of piezoelectric plates 75. As an example, FIG. 2 shows five piezoelectric plates 75 included in measuring element 74. However, any other number of piezoelectric plates 75 could be included in measuring element 74. Piezoelectric plates 75 are stacked on top of each other. Piezoelectric plates 75 are stacked in such a way that correspondingly charged sides are adjoining each other.

Piezoelectric transducer 73 further comprises a positive electrode 76 and a negative electrode 77. In between piezoelectric plates 75, positive electrode 76 is provided which extends along substantially all positively charged sides of piezoelectric plates 75 in a meandering course through the stack of piezoelectric plates 75. In a similar fashion, negative electrode 77 is provided which extends along substantially all negatively charged sides of piezoelectric plates 75 in a meandering course through the stack of piezoelectric plates 75. In this way, positive electrode 76 and negative electrode 77 are meandering through the stack of piezoelectric plates 75 substantially from a first end of measuring element 74 to a second end thereof.

Two feed-trough connectors 78, 79 are integrated in the walls of housing 7. Each connector 78, 79 comprises a positive pole 80, 81 and a negative pole 82, 83. Thus, the two different signal ways A, B through connectors 78, 79 indicated in FIG. 2 correspond to the signal ways A, B of accelerometer 1 indicated in FIG. 1. Although the two connectors 78, 79 are shown on two opposed lateral sides of housing 7 the connectors 78, 79 could also be co-located or physically integrated into one connector with electrically separated contact poles 80, 82 and 81, 83.

Positive poles 80, 81 of connectors 78, 79 are each directly connected to positive electrode 76 via a respective positive connection wire 84, 85. Thereby, positive connection wire 84 of connector 78 is connected to a first end 88 of positive electrode 76 and positive connection wire 85 of the other connector 79 is connected to a second end 89 of positive electrode 76. Similarly, negative poles 82, 83 of connectors 78, 79 are each directly connected to negative electrode 77 via a respective negative connection wire 86, 87. Thereby, negative connection wire 86 of connector 78 is connected to a first end 90 of negative electrode 77 and negative connection wire 87 of the other connector 79 is connected to a second end 91 of negative electrode 77. In this way, connectors 78, 79 are connected in parallel to piezoelectric transducer 73 at the opposed ends 88, 90 and 89, 91 of its electrodes 76, 77.

Thus, the positive and negative poles 80, 82 of first feedthrough connector 78 corresponding to channel A are connected to respective positive and negative electrodes 76, 77 at first end 88, 90 of the stack of piezoelectric plates 75 using connection wires 84, 86. The positive and negative poles 81, 83 of second feed-through connector 79 corresponding to channel B are connected to respective positive and negative electrodes 76, 77 at second end 89, 91 of the stack of piezoelectric plates 75 using connection wires 85, 87.

Like this an electric signal applied at negative pole 82 of first connector 78 at channel A will only be able to pass to negative pole 83 of second connector 79 at channel B if the entire chain of negative electrode 77 including connection wires 86, 87 and all corresponding connections are intact. Corresponding considerations apply for the entire chain of positive electrode 76. Thus, the test method described above in conjunction with FIG. 1 can advantageously be applied to also verify the functionality of sensing unit 72.

Figure 3:
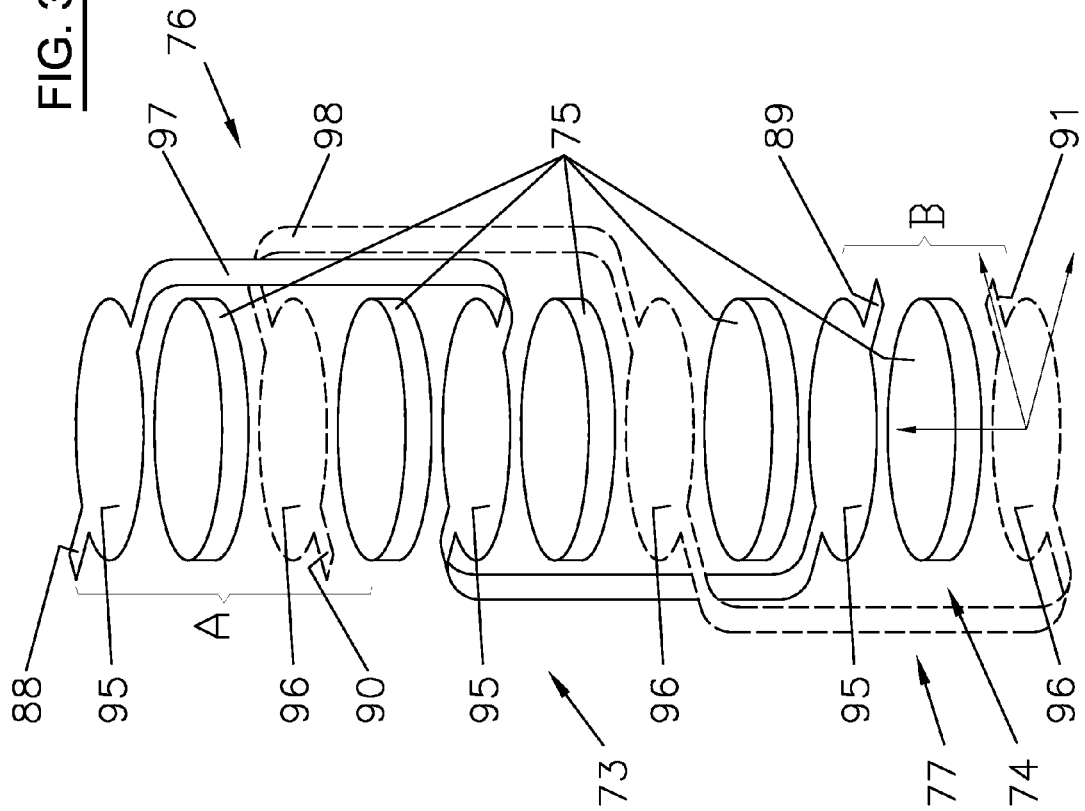
FIG. 3 is a detailed view of a piezoelectric transducer in the sensing unit of the accelerometer shown in FIG. 2.

FIG. 3 is a schematic exploded view of the piezoelectric transducer 73 in sensing unit 72 shown in FIG. 2. Piezoelectric plates 75 have a circular surface. Positive electrode 76 comprises positive contact plates 95 that match the surface of piezoelectric plates 75. Positive contact plates 95 are sandwiched in between two positively charged sides of piezoelectric plates 75. Similarly, negative electrode 77 comprises negative contact plates 96 that match the surface of piezoelectric plates 75. Negative contact plates 96 are sandwiched in between two negatively charged sides of piezoelectric plates 75.

Contact plates 95, 96 of respective electrodes 76, 77 are interconnected in series by conductive interconnectors 97, 98 arranged in between. Each conductive interconnector 97, 98 extends along an exterior face of the piezoelectric plates 75. Electrodes 76, 77 are bent at the respective transition regions between contact plates 95, 96 and conductive interconnectors 97, 98. In this way, a meandering course of electrodes 76, 77 is provided.

Further indicated in FIG. 3 are the upper end 88, 90 and the lower end 89, 91 of positive electrode 76 and negative electrode 77 to which the separate signal channels A, B are contacted. Thus, positive electrode 76 comprises separate contact points 88, 89 for separately contacting each transmission channel 4, 5. Correspondingly, negative electrode 77 comprises separate contact points 90, 91 for separately contacting each transmission channel 4, 5.

Figure 4:
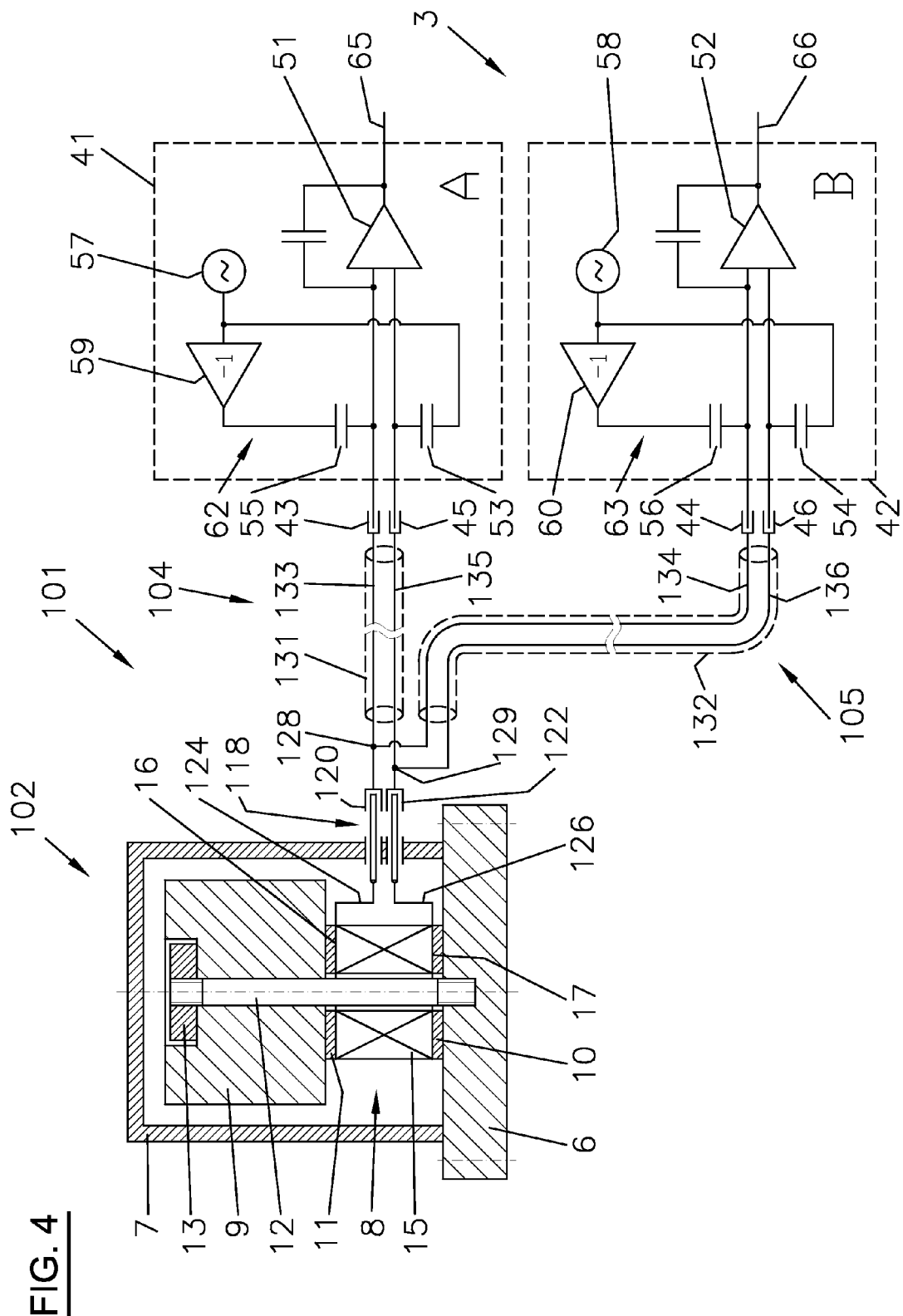
FIG. 4 is a schematic representation of an accelerometer according to a third embodiment.

FIG. 4 shows a third embodiment of an accelerometer 101 according to the invention. Components of accelerometer 101 that directly correspond to respective components of accelerometer 1 shown in FIG. 1 are indicated by the same reference signs.

The sensing unit 102 of accelerometer 101 differs from sensing unit 2 of accelerometer 1 in that only a single feedthrough connector 118 is integrated in the wall of housing 7. A positive pole 120 of feed-through connector 118 is directly connected with positive electrode 16 via a positive connection wire 124. A negative pole 122 of feed-through connector 118 is directly connected with negative electrode 17 via a negative connection wire 126.

Respective transmission cables 131, 132 of the transmission channels 104, 105 are interconnected in parallel to single connector 118. Each signal cable 131, 132 comprises a positive signal line 133, 134 and a negative signal line 135, 136. Positive signal lines 133, 134 meet at a common node 128 in close proximity to single feed-through connector 118. Negative signal lines 133, 134 meet at a common node 129 in close proximity to single feed-through connector 118. From common nodes 128, 129 a respective common connector line leads to positive pole 120 of connector 118 and to negative pole 122 of connector 118, respectively. In this way, transmission channels 104, 105 are also connected in parallel to piezoelectric transducer 108.

Figure 5:
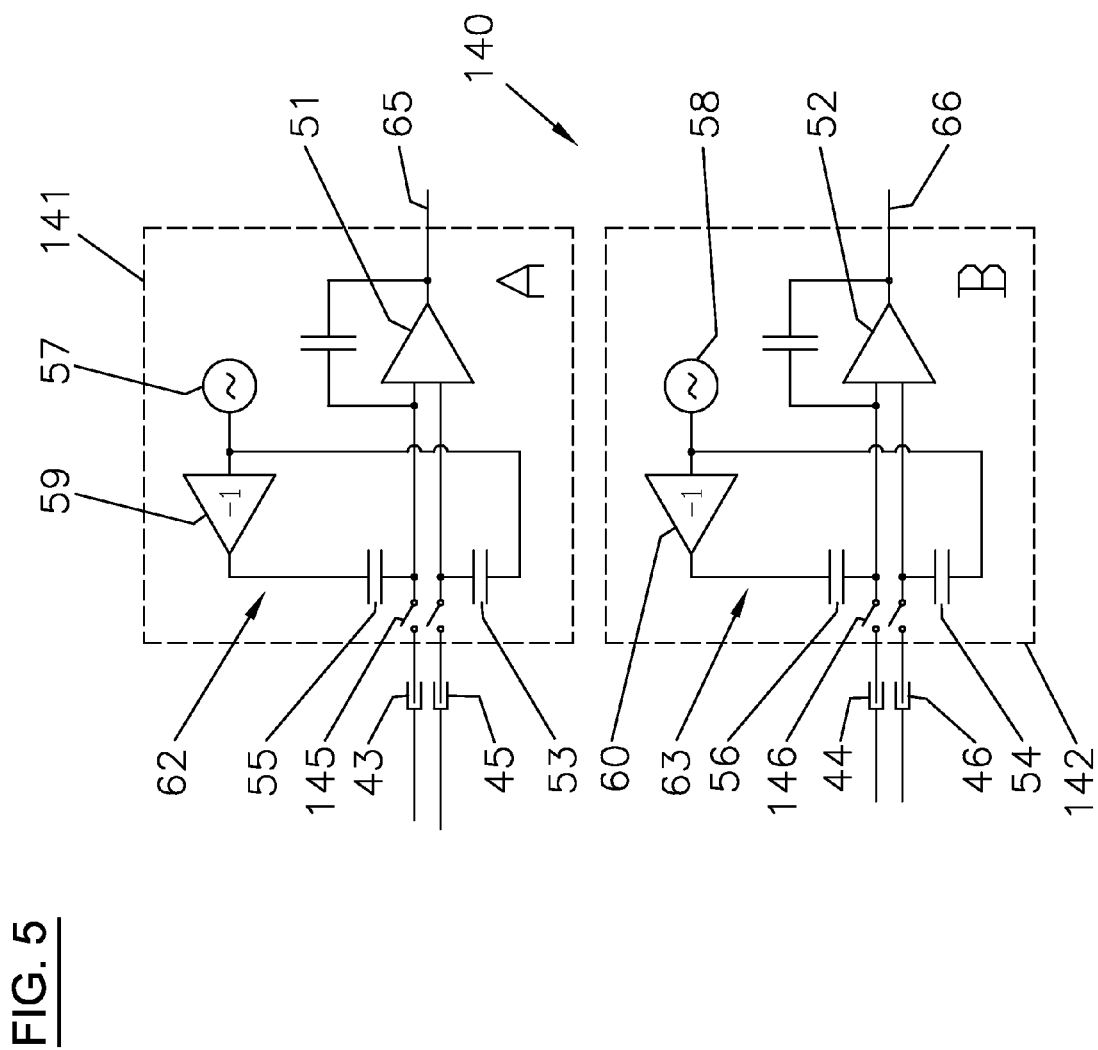
FIG. 5 is a schematic representation of an electronics unit that can also be built into the accelerometer shown in FIGS. 1, 2 and 4.

FIG. 5 shows an electronics unit 140 that can be applied in the place of electronics unit 3 described above. Components of electronics unit 140 that directly correspond to respective components of electronics unit 3 shown in FIGS. 1 and 4 are indicated by the same reference signs.

Electronics unit 140 comprises two substantially identical subunits 141, 142. After the inputs 43, 44 and 45, 46 of each subunit 141, 142, respective serial switches 145, 146 are arranged. Switches 145, 146 permit a selective application of subunits 141, 142, in particular of their respective signal amplifier 51, 52 and/or test signal injector 62, 63, in the accelerometer 1, 101. Thus, only one or both or none of subunits 141, 142 can be selectively connected to the respective transmission cables 31, 32, 131, 123. This selective application of subunits 141, 142 allows to further improve the detection of a possible error location.

Overall, in the above exemplary embodiments of the invention, a dual channel measuring system using an accelerometer with a single transducer element but with two separate connectors A and B has been presented. The individual (positive and negative) electrodes of the piezoelectric transducer element may be connected electrically in parallel to two separate feed-through connectors that are integral to the housing.

One preferred embodiment is characterized in that the positive and negative electrodes are meandering through the stack of piezoelectric plates from a first end to the opposite second end of the stack. The positive and negative poles of a first feed-through connector A may be connected to the respective positive and negative electrodes at the first end of the stack of piezoelectric plates and the positive and negative poles of a second feed-through connector B may be connected to the respective positive and negative electrodes at the second end of the stack of piezoelectric plates. Like this an electric signal applied at the negative pole of the first connector A may only be able to pass to the negative pole of the second connector B if the entire chain of the negative electrode including all connection wires is intact. The same reasoning may be applicable with respect to the positive electrode.

The remaining parts of such an exemplary redundant measuring system can be kept similar and in many parts identical to the prior art system, i.e. two separate transmission cables may be connected to the connectors A and B at the common element dual sensor and lead to the separate charge amplifiers.

An exemplary method according to the invention includes a permanent comparison of the outputs of channel A versus channel B. When a predetermined difference of the two channels is exceeded an alarm is triggered.

An example of the common element dual sensor vibration sensing system as per the invention may also include a built in test (=BIT) feature to test the complete vibration sensing system including the charge amplifier and upstream components of the measurement system but also the components downstream of the charge amplifier including the common element dual sensor. At the input of the charge amplifiers of channel A and channel B means may be provided which allow an injection of a test signal. The BIT sequence may be realized by injecting an individual calibrated charge signal at the input of charge the amplifier of the channel A. This test signal can transit the charge amplifier of channel A and the remaining upstream components and can finally be validated at the output A of the system. The same signal can transit from the injection point downstream through the transmission cable of channel A to the common element dual transducer and from there up the transmission cable of channel B and through the charge amplifier of channel B and the remaining upstream components and can be validated at the output B of the system.

This test method may allow a testing of the complete system including all functional parts of channel A and channel B. The BIT test can then be repeated with an injection of a charge signal at the charge amplifier of channel B and validated accordingly on the outputs of channel B and channel A. Although this is not strictly necessary to test the complete system it gives in case of a detected failure some further indication of in which part of the system failure may be found. With the selective use of serial switches at the input of the charge amplifier as per the optional feature shown in FIG. 5. it is possible to further refine the possible location of the failure.

A prior art dual system using a dual channel accelerometer may have a few common mode failures, i.e. failures which would compromise the good function of both channels A and B. This is due to failures of parts which are common to the two channels. These components are particularly the housing of the dual sensor and the common mass and preload bolt and nut but also the fact if a transducer is at all present in the installation.

The vibration sensing system per the invention using the common element dual sensor per the invention may have a few additional common mode failures as compared to the prior art system. This may be due to the fact that also the piezoelectric transducer element can be a common element for both channels. The system according to the invention, however, can be much superior to the prior art system because virtually all failures can be detected, which is not the case in the prior art system.

From the foregoing description, numerous modifications of the force sensor according to the invention and of a method for testing its operational reliability are apparent to one skilled in the art without leaving the scope of protection of the invention that is solely defined by the claims.

The invention claimed as:

1. A force sensor comprising a transducer with a measuring element operatively connected to a measuring object for generating measuring signals of a force acting on the measuring object, and at least two transmission channels configured to transmit mutually corresponding signals of said measuring signals independently from one another, each transmission channel comprising a positive signal line and a negative signal line, wherein said transmission channels are connected in parallel to the same transducer such that the transmitted signals at the output of each transmission channel can be verified, wherein said transducer comprises a positive and a negative electrode for collecting said measuring signals generated by said measuring element and each of said electrodes is connected to each of said transmission channels.

2. The force sensor according to claim 1, wherein said transducer is the single transducer operatively connected to the measuring object.

3. The force sensor according to claim 1, wherein the measuring object comprises at least one seismic mass such that said measuring signals are representative of a force acting on the seismic mass as a result of an acceleration of the seismic mass.

4. The force sensor according to claim 1, wherein the measuring object comprises at least one of a gas and a liquid such that said measuring signals are representative of at least one of a pressure and a pressure change of said at least one of a gas and a liquid.

5. The force sensor according to claim 1, wherein at least one connector is provided connecting at least one of said transmission channels to said electrodes.

6. The force sensor according to claim 5, wherein said transducer is enclosed in a housing and said connectors are integrated in the walls of said housing.

7. The force sensor according to claim 1, wherein the first of said transmission channels is connected to said electrodes at one end of said measuring element and the second of said transmission channels is connected to said electrodes at the opposed end of said measuring element.

8. The force sensor according to claim 1, wherein said measuring element is a piezoelectric measuring element.

9. The force sensor according to claim 8, wherein said piezoelectric measuring element is constituted by a stack of piezoelectric plates.

10. The force sensor according to claim 9, wherein said electrodes extend in a meandering course through said stack of piezoelectric plates.

11. The force sensor according to claim 1, wherein each of said transmission channels comprises a signal amplifier.

12. The force sensor according to claim 11, wherein said signal amplifier comprises means to decouple the DC part of the signal.

13. The force sensor according to claim 1, wherein a test signal injector is provided in at least one of said transmission channels.

14. The force sensor according to claim 13, wherein said test signal injector is provided at the input of at least one of said signal amplifiers.

15. A method for testing the operational reliability of a force sensor according to claim 13, wherein a test signal is injected into at least one of said transmission channels by said test signal injector, and the test signal is evaluated in the transmission channel in which the test signal has been injected and in another transmission channel in which the test signal has not been injected.

16. A monitoring system for vibrating or rotating engines comprising at least one force sensor according claim 1.

17. A method for testing the operational reliability of a force sensor according to claim 1, wherein said measuring signals generated by said transducer and transmitted by said transmission channels are compared and the result of the comparison is used to assess the correctness of the transmitted signals.

* * * * *